United States Patent [19]
Takemoto et al.

[11] Patent Number: 4,551,742
[45] Date of Patent: Nov. 5, 1985

[54] SOLID-STATE IMAGING DEVICE

[75] Inventors: Iwao Takemoto, Tokyo; Shiya Ohba, Kanagawa; Masakazu Aoki, Kodaira; Haruhisa Ando, Hachioji; Masaaki Nakai, Kodaira; Toshifumi Ozaki, Tokyo; Masao Tamura; Masanobu Miyao, both of Tokorozawa, all of Japan

[73] Assignee: Hitachi, Ltd., Tokyo, Japan

[21] Appl. No.: 640,570

[22] Filed: Aug. 14, 1984

Related U.S. Application Data

[63] Continuation of Ser. No. 328,621, Dec. 8, 1981.

[30] Foreign Application Priority Data

Dec. 8, 1980 [JP] Japan .................... 55-184784[U]

[51] Int. Cl.$^4$ .................................... H01L 27/14
[52] U.S. Cl. ........................... 357/31; 357/30; 357/49; 357/23.6; 357/23.11; 357/23.1
[58] Field of Search ............... 357/49, 30, 31, 23.6, 357/23.11, 23.1

[56] References Cited

U.S. PATENT DOCUMENTS 4,176,369 11/1979 Nelson .................... 357/30 X
4,316,205 2/1982 Aoki et al. ............... 357/31 O
4,405,935 9/1983 Baji et al. ................ 357/31 O

FOREIGN PATENT DOCUMENTS 54-55870 11/1980 Japan .

Primary Examiner—Martin H. Edlow
Attorney, Agent, or Firm—Antonelli, Terry & Wands

[57] ABSTRACT

A solid-state imaging device is provided with picture elements which are each composed of a photoelectric conversion element and a MOS transistor as a switching element and which are arranged in the form of a matrix. A scanning mechanism sequentially scans the picture elements to sequentially read out photoelectric conversion signals. To eliminate smear and reduce parasitic capacitance, a high-impurity-concentration diffusion layer serving as an output terminal of the MOS transistor constituting the picture element is formed on an insulator layer for isolating the elements.

13 Claims, 11 Drawing Figures

SOLID-STATE IMAGING DEVICE

This is a continuation of application Ser. No. 328,621 filed Dec. 8, 1981.

BACKGROUND OF THE INVENTION

This invention relates to a solid-state imaging device for use in a television camera etc., and more particularly to the structure of a picture element thereof.

FIG. 1 is a schematic diagram showing the arrangement of a solid-state imaging device. A photoelectric conversion element made of a photodiode 1, and an insulated-gate field effect transistor (hereinbelow, abbreviated to "MOS transistor") 2 for a vertical scanning switch constitute one picture element. Using a horizontal scanning circuit 9 as well as a vertical scanning circuit 10 made of a shift register and MOS transistors 3 for horizontal scanning switches, optical signals stored in the photodiodes 1 are sequentially led out to an output terminal 8 in conformity with the scanning type of television. The figure illustrates the basic form. Especially regarding the signal output system, there are various modifications, for example, the provision of a plurality of signal output lines 6 or 7 for simultaneously delivering color signals in color imaging systems, and the construction of scanning circuits employing charge transfer devices. In addition, there is a modified vertical scanning system conforming with the interlaced scanning of television. Further, there is a modification pertaining to picture elements for improved photoelectric conversion characteristics as disclosed in U.S. Pat. No. 4,148,048. The ensuing description is similarly applicable to these modifications. While devices whose signal charges are electrons will be described, the ensuing description is quite similarly applicable to devices utilizing holes as their signal charges, merely by inverting the polarity and the conductivity types.

FIG. 2 is a schematic sectional view of a picture element. The problems of the prior art will be explained with reference to this figure.

A p-type Si substrate 12 and an n-type diffusion layer 13 construct the photodiode 1, while the n-type diffusion layer 13, a gate electrode 15 made of polycrystalline Si or the like and an n-type diffusion layer 14 serving as an output terminal construct the switching MOS transistor 2. A photoelectron 19 generated by the incidence of light 18 is stored in a junction capacitance 20, and a positive voltage pulse issued by the vertical scanning circuit 10 is impressed on the gate electrode 15, whereby the photoelectron is delivered through the n-type diffusion layer 14 every scanning period. Numeral 16 designates an insulating film made of $SiO_2$ or the like.

This picture element of the prior art has serious disadvantages in the following two points.

The first concerns noise charges. Numeral 23 represents photoelectrons generated within the Si substrate 12 which form a component which does not flow into the n-type diffusion layer 13 but flows instead into the n-type diffusion layer 14, as shown by arrow 24. This component is superposed on the signal of another picture element sharing the vertical signal output line 6 (a metal interconnection 17 in FIG. 2) when the signal is read out. In case of imaging a bright object, therefore, a bright line or stripe appears in the vertical direction in a reproduced picture and spoils the picture quality (this phenomenon is called a "smear"). This is a serious disadvantage which is common to solid-state imaging devices and on account of which they are much inferior to image pickup tubes.

The other disadvantage concerns parasitic capacitances. The n-type diffusion layer 14 has a junction capacitance 21 similar to the junction capacitance 20 of the photodiode. The vertical signal output line 6 connects such junction capacitances 21 in parallel to the number of picture elements arrayed in the vertical direction (this number depends upon the signal readout system, and is about 250 or 500 in case of the NTSC standard format). The resultant parasitic capacitance 21 becomes very large. The parasitic capacitance causes the occurrence of thermal noise, in which a small photoelectric conversion signal becomes buried. In effect, the sensitivity of the imaging device is thereby drastically lowered.

SUMMARY OF THE INVENTION

This invention has for its object to provide an expedient for realizing a solid-state imaging device which, in contrast to the prior-art devices, is free from the smear and reduces the parasitic capacitance of a vertical signal output line and is accordingly low in noise and high in sensitivity.

The solid-state imaging device of this invention has a structure in which a region serving as the output terminal of a switching MOS transistor constituting a picture element portion is disposed on an insulating film.

Further, in the solid-state imaging device of this invention, that region of a switching MOS transistor constituting a picture element portion which underlies a gate electrode can be disposed on an insulating film.

DESCRIPTION OF THE PREFERRED EMBODIMENTS

Hereunder, the solid-state imaging device of this invention will be described in connection with embodiments.

Figure 1:
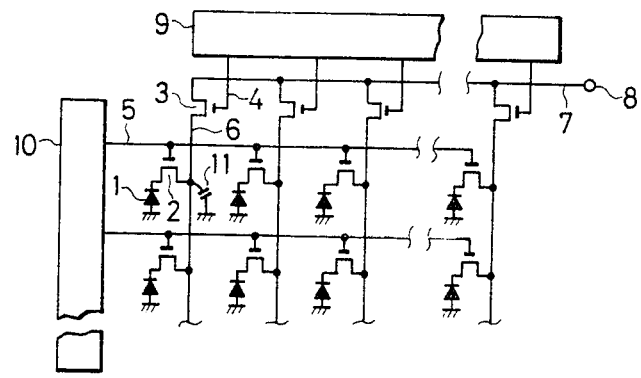
FIG. 1 is a schematic circuit diagram showing the arrangement of a solid-state imaging device.
Figure 2:
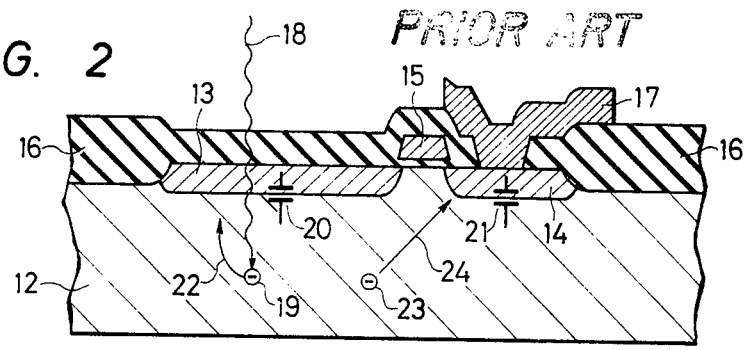
FIG. 2 is a sectional view showing the prior-art structure of a picture element portion in the solid-state imaging device.
Figure 3:
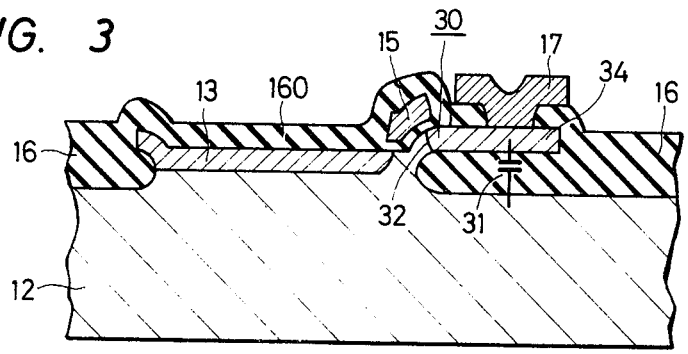
FIG. 3 is a sectional view showing an embodiment of the structure of a picture element portion in a solid-state imaging device according to this invention.

FIG. 3 illustrates an embodiment of the solid-state imaging device of this invention, and shows the sectional structure of a picture element portion. In the figure, numeral 12 designates an Si body of the p-type conductivity (the expression "body" signifies an epitaxially grown layer formed on a substrate, a well-diffused layer formed within a substrate, a substrate itself, etc.). Numeral 13 indicates an n-type conductivity region, numeral 15 a gate electrode (made of polycrystalline Si or the like), numeral 16 a thick insulating film (made of SiO₂ or the like) for isolating elements from each other, numeral 160 an insulating film (made of SiO₂ or the like), numeral 17 an interconnection layer (made of Al or the like) for a vertical signal output line, and numeral 34 an n-type Si layer.

As illustrated in the embodiment of FIG. 3, the subject matter of the present invention consists in that the n-type layer 34 serving as an output terminal is formed on the insulating layer, typified by SiO₂ film, 16 which is thick and is of low permittivity. In this structure, photoelectrons generated within the Si body 12 can only flow in through a narrow junction 32, and the flow is conspicuously limited. Further, under ordinary operating conditions, an electric field which drives electrons away acts under the gate electrode 15 in a period of time other than at the signal readout period, so that substantially no photoelectrons flow into the n-type layer 34. In addition, a parasitic capacitance 31 is remarkably reduced owing to the low permittivity and great thickness of the insulating layer 16. As a result, the smear is avoided, and a device of low noise and high sensitivity is fabricated.

In order to attain good characteristics with little leakage current, the junction 32 should desirably lie within a single crystal layer continuous from the Si body 12. Although the whole n-type layer 34 need not be a single crystal, the present invention is characterized by comprising on the insulating layer 16 a single crystal layer 30 which extends, at least, beyond the junction 32. Referring now to FIGS. 4A–4D, an example of a process for manufacturing the device of the present embodiment will be described.

Figure 4A:
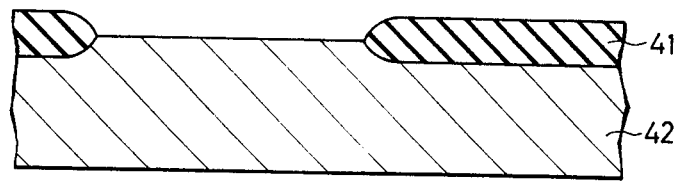
FIGS. 4A to 4D are sectional views showing in the order of steps an example of a process for manufacturing the picture element portion of the solidstate imaging device of this invention.
Figure 4B:
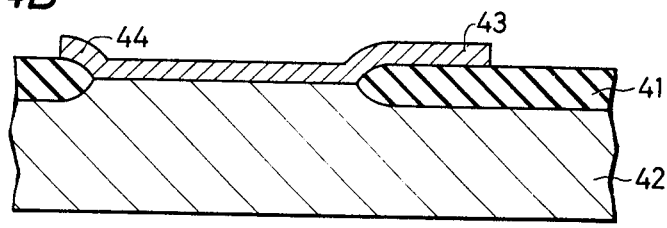

The device of this invention can be manufactured essentially by utilizing the ordinary Si-gate NMOS LSI technology. An SiO₂ film 41 which serves to isolate elements and which is approximately 1 μm thick is selective oxidation (FIG. 4A). Subsequently, an amorphous or polycrystalline Si layer 43 which is approximately 0.5 μm thick is formed by such an expedient as sputtering, electron-beam evaporation and vapor growth, and the unnecessary parts of the Si layer are removed by the conventional photolithographic technology so as to leave a necessary extension on the SiO₂ film 41 (FIG. 4B). Even when an extension 44 forming an end of a photodiode is not disposed, no particular problem is posed. In forming the Si layer 43, an impurity for turning it into the p-conductivity type, such as B (boron), may well be mixed in a very small amount.

Figure 4C:
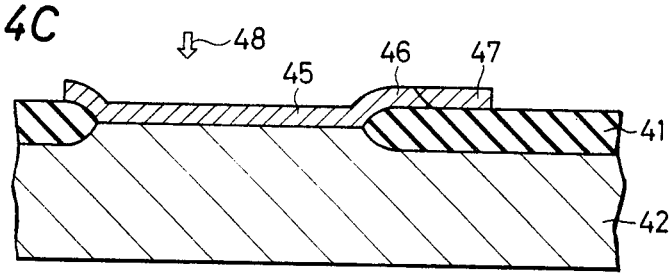

Now, let it be supposed that the Si layer 43 is polycrystalline. When it is scanned with, for example, a CW laser beam 48 or Ar at 12 W at a speed of about 50 cm/sec., an Si layer 45 lying in contact with the p-type Si body 42 turns into a single crystal and a single crystal layer 46 extending on the SiO₂ film is subsequently grown as explained in U.S. Pat. No. 209,113 or German Offenlegungsschrift DE No. 3043913 (FIG. 4C). While the amount of extension of the single crystal layer 46 depends upon the heating condition and time, the purpose can be substantially achieved with an amount of at least 2 μm. Of course, the remaining polycrystalline layer 47 may well be entirely turned into the single crystal. The heating temperature is not restricted to a value of or above the melting point (∼1400° C.) of Si, but the solid phase single-crystal growth proceeds even at a temperature below the melting point, for example, a temperature of approximately 1100° C. In addition, a similar effect can be attained with another heating method, for example, heating with a pulse laser beam, an electron beam or by the conventional electric furnace.

Figure 4D:
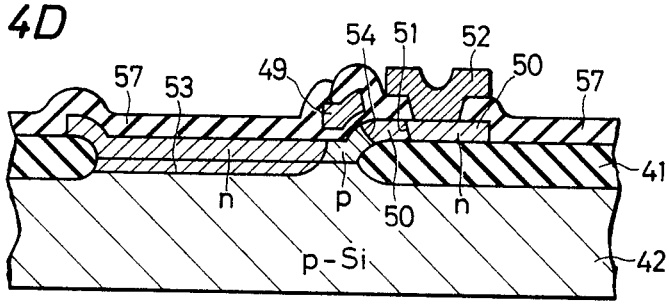

Thereafter, quite similarly to the prior art, there are formed an SiO₂ film 57, a gate electrode 49 made of polycrystalline Si, n-type diffusion layers 50 and 53, and a vertical signal output line 52 made of Al, thus to obtain the intended device (FIG. 4D). Insofar as the interface 51 between the single-crystal Si and the polycrystalline Si is included in the n-type diffusion layer 50 (a p-n junction being indicated at 54), most of the n-type diffusion layer 50 may be of the polycrystalline Si.

Figure 5:
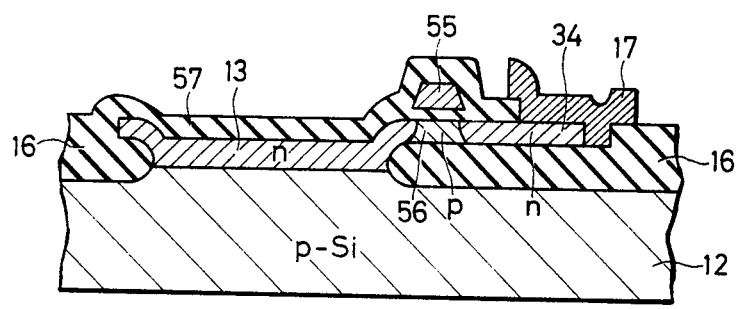
FIG. 5 is a sectional view showing another embodiment of the structure of a picture element portion in the solid-state imaging device of this invention.
Figure 6:
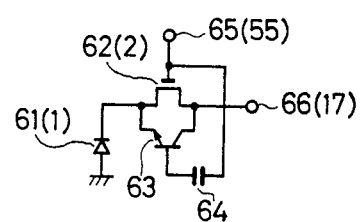
FIG. 6 is a circuit diagram showing the equivalent circuit of the picture element portion in FIG. 5.

Another embodiment of this invention is shown in FIG. 5. Unlike the foregoing embodiment shown in FIG. 3, a region 56 underlying a gate electrode 55 is also formed on the single-crystal Si layer extending on the insulating film 16. In this case, photoelectrons generated in the Si body 12 are perfectly isolated from the n-type layer 34. Owing to the presence of the p-type region 56 spaced from the Si body 12, the equivalent circuit of the picture element has a parasitic bipolar transistor 63 (13 - 56 - 34) and a gate capacitance 64 added as illustrated in FIG. 6. This, however, is solely contributive to enhancing the switching speed and does not bring about any undesirable effect as observed in an SOS (Silicon On Sapphire) device. It is common to all the embodiments that, even when the vertical signal output line 17 is formed in a manner to protrude beyond the n-type layer 34 as illustrated in FIG. 5, the characteristics of the device are not affected because the underlying layer is the insulating film 16 in contrast to the case of the prior art. This is also effective to remarkably loosen the alignment tolerance between the layers and to facilitate the processing.

Figure 7:
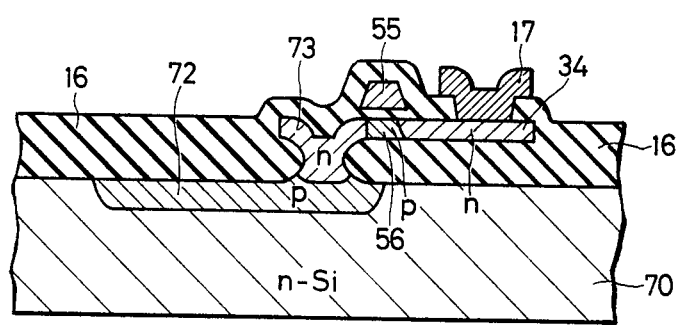
FIG. 7 is a sectional view showing still another embodiment of the structure of a picture element portion in the solid-state imaging device of this invention.
Figure 8:
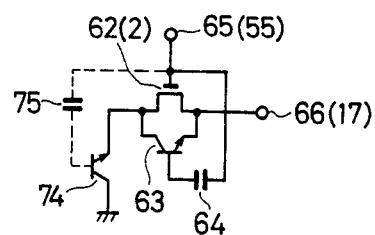
FIG. 8 is a circuit diagram showing the equivalent circuit of the picture element portion in FIG. 7.

Still another embodiment of this invention is shown in FIG. 7. It is fabricated by employing an n-type Si body 70 instead of the p-type Si body and forming a p-type diffusion layer 72 by the conventional preferential diffusion method before the selective oxidization in FIG. 4A. As illustrated by the equivalent circuit of the picture element in FIG. 8, the photodiode becomes a p-n-p bipolar type phototransistor 74 (72 - 73 - 56), and a device of sharply enhanced sensitivity having the amplifier within the picture element is realized. In spite of the solid-state imaging device employing the phototransistor, the manufacturing method is remarkably simplified. The solid-state imaging device is structurally suited to a high density of integration (similarly to the case of the photodiode), and exhibits a high sensitivity as well as a high resolution. Needless to say, the measure of improvement in which a p-type body is used and an n-type diffusion layer is further disposed under the p-type diffusion layer 72 so as to attain a nearly ideal spectral sensitivity or the measure of improvement in which a coupling capacitance 75 (FIG. 8) is added between the gate electrode 55 and the p-type diffusion layer 72 so as to better the readout of small signals can be adopted without spoiling the effect a bit.

As set forth above, according to this invention, an imaging device which is free from the smear and which has a high sensitivity can be readily realized.

What is claimed is:
1. A solid-state imaging device comprising:
a substrate;

a plurality of photoelectric conversion elements formed on said substrate;

a plurality of switching means formed on said substrate, said switching means each being coupled to a respective photoelectric conversion element to form a plurality of picture element pairs in said substrate, each of said picture element pairs comprising a photoelectric conversion element and a switching means, said picture element pairs being arranged in an array in said substrate, wherein each of said switching means is formed of a plurality of semiconductor regions including a first region for receiving a signal from said photoelectric conversion element, a second region for providing an indication of a state of said photoelectric conversion element signal received at said first region, and a third region coupled between said first and second regions to control the transfer of said indication of said state of said photoelectric conversion element signal from said first region to said second region; and scanning means coupled to said third region for controlling the transfer of said indication of said state of said photoelectric conversion element signal from said first region to said second region, wherein said second region is disposed on an insulating film overlaying said substrate, said insulating film having a predetermined thickness which is sufficient to prevent a flow of photoelectrons generated in said photoelectric conversion element into said second region.

2. A solid-state imaging device according to claim 1, wherein said switching element is made of an insulated-gate field effect transistor which includes said first and second semiconductor regions and a gate electrode disposed through a gate insulating film on said third semiconductor region situated between said first and second semiconductor regions.

3. A solid-state imaging device according to claim 2, wherein said semiconductor body has a first conductivity type, said first and second semiconductor regions have a second conductivity type opposite to said first conductivity type, a photodiode is formed of said first semiconductor region and said semiconductor body, and said second semiconductor region is disposed on said insulating film.

4. A solid-state imaging device according to claim 3, wherein said third semiconductor region is also disposed on said insulating film.

5. A solid-state imaging device according to claim 3 or 4, wherein a single-crystal semiconductor layer is formed in a manner to extend from a surface of said semiconductor body to a surface of said insulating film, and at least a part of said second semiconductor region is made of said single-crystal semiconductor layer overlying said insulating film.

6. A solid-state imaging device according to claim 3 or 4, wherein a single-crystal semiconductor layer is formed in a manner to extend from a surface of said semiconductor body to a surface of said insulating film, while a polycrystalline or amorphous semiconductor layer is formed on said insulating film in a manner to couple with said single-crystal semiconductor layer, and said second semiconductor region is made of the single-crystal semiconductor layer overlying said insulating film and said polycrystalline or amorphous semiconductor layer.

7. A solid-state imaging device according to claim 3 or 4, wherein said insulating film is an insulating film for isolating the picture elements.

8. A solid-state imaging device according to claim 2, wherein said photoelectric conversion element is made of a phototransistor comprised of said first and third regions and a fourth semiconductor region located between said first and third regions, and at least said second region of said insulated-gate field effect transistor is disposed on said insulating film.

9. A solid-state imaging device according to claim 8, wherein said semiconductor layer is made of a single-crystal layer which is disposed in a manner to extend from a surface of said semiconductor body to a surface of said insulating film.

10. A solid-state imaging device according to claim 8, wherein said semiconduictor layer is made of a single-crystal layer which is disposed in a manner to extend from a surface of said semiconductor body to a surface of said insulating film, and a polycrystalline or amorphous layer which is disposed on said insulating film in a manner to couple with said single-crystal layer.

11. A solid-state imaging device according to claim 5, wherein said insulating film is an insulating film for isolating the picture elements.

12. A solid-state imaging device according to claim 6, wherein said insulating film is an insulating film for isolating the picture elements.

13. A solid-state imaging device according to claim 1, wherein said insulating film is approximately 1 $\mu$m thick.

* * * * *